United States Patent
Gorin

(10) Patent No.: US 8,112,238 B1
(45) Date of Patent: Feb. 7, 2012

(54) METHOD OF ALIGNMENT FOR RADIO FREQUENCY MEASUREMENT INSTRUMENT AND MEASUREMENT INSTRUMENT INCLUDING SAME

(75) Inventor: Joseph M. Gorin, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 494 days.

(21) Appl. No.: 12/410,006

(22) Filed: Mar. 24, 2009

(51) Int. Cl.
*G01R 27/00* (2006.01)

(52) U.S. Cl. ........ 702/107; 702/76; 702/106; 324/76.19

(58) Field of Classification Search .................. 702/107, 702/106, 76; 324/76.23, 76.19, 76.27, 76.26, 324/76.35
See application file for complete search history.

(56) References Cited

U.S. PATENT DOCUMENTS

| | | | |
|---|---|---|---|
| 4,858,159 A | 8/1989 | Wheelwright et al. | |
| 6,018,702 A | 1/2000 | Luiz | |
| 6,978,125 B2 | 12/2005 | Lindell et al. | |
| 7,054,773 B2 * | 5/2006 | Gray et al. | 702/76 |
| 2003/0188254 A1 | 10/2003 | Lusky et al. | |
| 2007/0139132 A1 | 6/2007 | Gorin et al. | |

FOREIGN PATENT DOCUMENTS

GB 2338792 A 12/1999

* cited by examiner

*Primary Examiner* — Drew A Dunn
*Assistant Examiner* — Hien Vo

(57) ABSTRACT

A method is provided for aligning a measurement instrument that includes a tunable filter. The method includes: (i) applying an output signal of an internal noise source of the measurement instrument to the input of the tunable filter, (ii) applying a control signal to the tunable filter to tune the tunable filter to a selected alignment frequency, (iii) measuring a value for a gain alignment parameter of the tunable filter while the output signal of the internal noise source is applied to the input of the tunable filter and the control signal is applied to the tunable filter, (iv) storing the measured gain alignment parameter value in an alignment table in the memory device, and (v) repeating steps (ii) through (iv) for a plurality of selected alignment frequencies in an operating frequency range of the tunable filter.

20 Claims, 9 Drawing Sheets

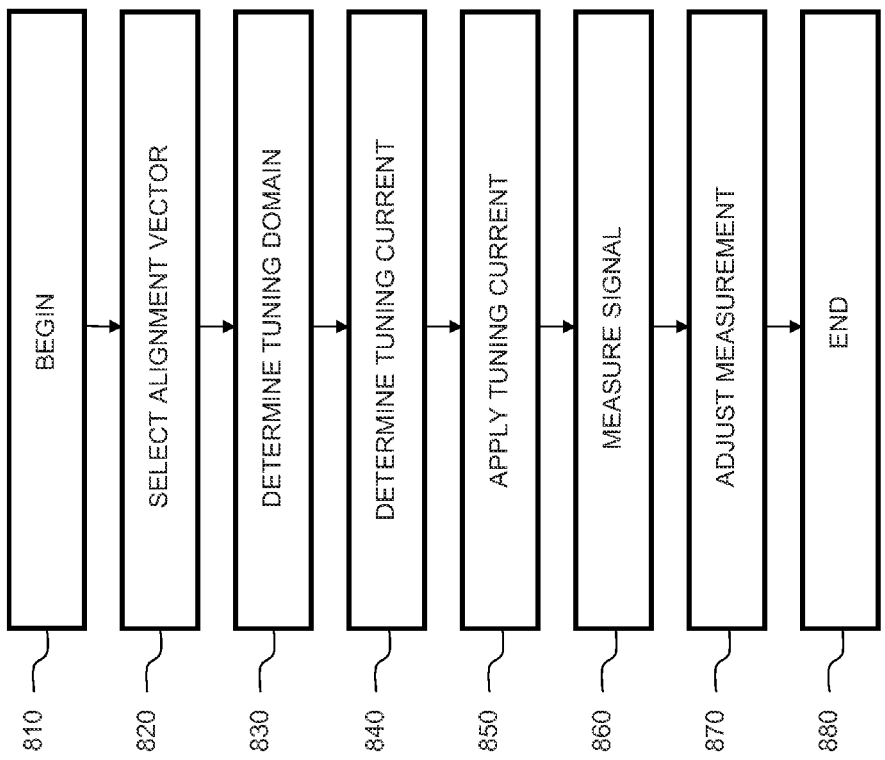

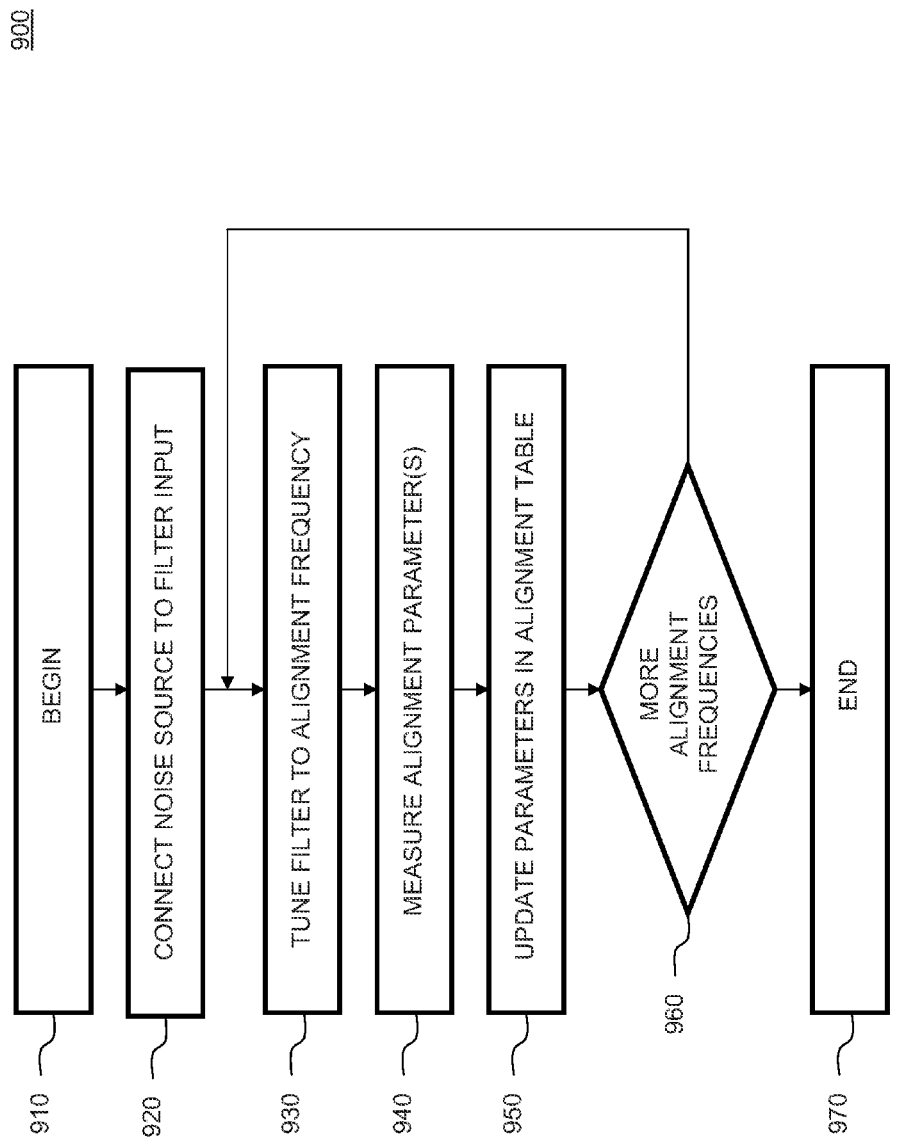

METHOD OF ALIGNMENT FOR RADIO FREQUENCY MEASUREMENT INSTRUMENT AND MEASUREMENT INSTRUMENT INCLUDING SAME

BACKGROUND

Measurement instruments are commonly employed for determining various characteristics of radio frequency (RF) signals. One example of such a measurement instrument is a spectrum analyzer.

FIG. 1 shows a functional block diagram illustrating one embodiment of a front end section of a spectrum analyzer 100. Spectrum analyzer 100 includes an adjustable input attenuator 102, an attenuation control 104, a switch 106, switch control 108, low band circuits 110, a tunable filter 112, a tuning control 114, and high band circuits 116.

Low band circuits 110 and high band circuits 116 process signals at different ranges of frequencies. In one embodiment, for example, low band circuits 110 process "low frequency" signals having frequencies less than about 3.6 GHz, and high band circuits 116 process "high frequency" signals having frequencies from about 3.6 GHz to 26.5 GHz.

In one embodiment, for example, attenuation control 104 may operate in response to a user input that indicates a level of input attenuation to be applied corresponding to a signal level being applied to the input of spectrum analyzer 100. Switch control 108 may operate in response to a frequency selection made by a user to indicate a band of interest where an input signal is to be measured. In one embodiment, the functional blocks of attenuation control 104, switch control 108, and tuning control 114 are implemented in whole or in part by a processor, or under control of a processor as a result of user input(s) to control operations of spectrum analyzer 100.

Typically, tunable filter 112 is an yttrium-iron-garnet (YIG) tuned filter (YTF). Accordingly, to provide a concrete example and explanation of an operation of spectrum analyzer 100, hereafter tunable filter 112 will be referred to as YTF 112. YTF 112 has a tunable passband where signal loss is relatively low, while signals at frequencies outside the passband have a substantial loss. Beneficially, the passband of YTF 112 is tunable across the frequency band of high band circuits 116 (e.g., from 3.6-26.5 GHz) in response to a tuning current supplied by tuning control 114. The passband of YTF 112 may be defined in a variety of ways, but is often defined as the being bounded by the upper and lower frequencies beyond which the attenuation of YTF 112 is more than X dB (e.g., 4.5 dB) greater than the attenuation at the center frequency of the passband. The frequency range spanned by the passband of YTF 112 is referred to as its bandwidth, and in practice the bandwidth may vary as a function of the frequency to which YTF 112 is tuned. As an illustrative example, in one embodiment of YTF 112, the bandwidth is in a range of 50 MHz when YTF 112 is tuned to 3.6 GHz, and in a range of 100 MHz when YTF 112 is tuned to 18 GHz.

FIG. 2 shows an example of a passband frequency response of one embodiment of YTF 112. In FIG. 2, reference numerals 201 and 202 denote the lower and upper −4.5 dB frequency points that are used, in this example, to define the passband. Reference numeral 203 indicates the peak frequency, and reference numeral 204 indicates the center frequency of the passband. As can be from FIG. 2, in practice the passband of YTF 112 is not perfectly flat. Instead there is typically an amplitude variation or ripple across the passband.

As noted above, the passband of YTF 112 is tuned by application of a tuning current, for example supplied by tuning control 114 in FIG. 1. In general, the frequency-versus-tuning-current response of YTF 112 is, to a first order or approximation, linear. However, for a high quality measurement instrument, the deviation of the tuning response of YTF 112 from a perfectly linear response is significant. In particular, it can be seen from FIG. 2 that a relatively small deviation in the tuned frequency of YTF 112 may produce a significant change in the amplitude response. When spectrum analyzer 100 is used to measure a signal that passes through YTF 112 and high band circuits 116, this amplitude variation of YTF 112 must be accounted for and corrected.

Accordingly, in some embodiments, spectrum analyzer 100 is subjected to a calibration cycle. An externally-generated signal having a known calibration frequency (i.e., traceable back to known and accepted standards) is supplied to the input of spectrum analyzer 100, and a tuning current is applied to YTF 112 that should tune the center frequency of YTF 112 to the calibration frequency if the frequency-versus-tuning-current response of the YTF was perfectly linear. The actual tuning response of YTF 112 is measured. The process is repeated at K different calibration frequencies (e.g., K=200) spanning the operating frequency band of YTF 112 and high band circuits 116. The K measured data points measured during such a calibration then may be used during normal operations of spectrum analyzer 100 to correct for the non-linearity in the tuning response of the YTF.

Unfortunately, the tuning response of a YIG is known to vary with time and according to environmental factors including temperature—including in particular the temperature of the coupling loops in the YIG device.

FIG. 3 illustrates some measured data that plots changes in the frequency-versus-tuning-current response for one embodiment of a YTF as a function of temperature, and further as a function of operating frequency. As can be understood from FIG. 3, at any given tuning current level, the actual tuned center frequency of the YTF varies with temperature. Furthermore, the amount of variation in the center frequency increases with increasing operating frequency. So, for example, it can be seen that for a tuning current that produces a nominal center frequency of 3.6 GHz, the actual center frequency varies over a range of about 3 MHz over a temperature range of 20-55° C., while at a nominal center frequency of 25 GHz, the actual center frequency varies over about 27 MHz over a temperature range of 20-55° C.

In fact, YTFs drift with age and drive history in ways that have poor predictability.

In current practice, the YTF is centered before a calibration point is measured, and it is centered before verification, prior to making a measurement, but those centerings are not identical, leading to calibration errors. Furthermore, there is a tradeoff between having lots of calibration frequencies, for better prediction of the response versus frequency, and having few calibration frequencies, for lower calibration costs. This tradeoff is inconvenient.

What is needed, therefore, is an improved method for compensating for tuning inaccuracies in a tunable filter in a measurement instrument, such as a spectrum analyzer. What is also needed is a measurement instrument such as a spectrum analyzer that incorporates such an improved method.

SUMMARY

In an example embodiment, a method is provided for operating a spectrum analyzer that includes an yttrium-iron garnet (YIG) tuned filter (YTF), an internal noise source, and a memory device. The method comprises performing an alignment of a tuning response of the YTF. The alignment comprises: (i) applying a noise signal generated by the internal noise source of the spectrum analyzer to the input of the YTF; (ii) applying a tuning current to the YTF to tune the YTF to a selected alignment frequency, (iii) measuring a value of a gain alignment parameter of the YTF while the noise signal is applied to the input of the YTF and the tuning current is applied to the YTF, (iv) storing the measured gain alignment parameter value in an alignment table in the memory device, and (v) repeating steps (ii) through (iv) for a plurality of selected alignment frequencies in an operating frequency range of the YTF. The method further includes: receiving an externally-supplied signal at an input of the spectrum analyzer; tuning the YTF to an operating frequency for measuring a characteristic of the externally-supplied signal; and measuring the characteristic of the externally-supplied signal at the operating frequency using the YTF and a correction factor that is determined from one of the gain alignment parameter values in the alignment table.

In another example embodiment, a measurement instrument comprises: a signal input configured to receive an externally-supplied signal; a noise source; a tunable filter; a measurement circuit connected to receive an output of the tunable filter; a switch adapted to selectively connect one of the input and the noise source to an input of the tunable filter; a memory device; and a processor configured to control the switch and the tunable filter. The processor is configured to execute an alignment algorithm. The alignment algorithm comprises: (i) applying an output signal of an internal noise source of the measurement instrument to the input of the tunable filter, (ii) applying a control signal to the tunable filter to tune the tunable filter to a selected alignment frequency, (iii) measuring a value of a gain alignment parameter of the tunable filter while the output signal of the internal noise source is applied to the input of the tunable filter and the control signal is applied to the tunable filter, (iv) storing the measured gain alignment parameter value in the memory device, and (v) repeating steps (ii) through (iv) for a plurality of selected alignment frequencies in an operating frequency range of the tunable filter.

In yet another example embodiment, a method is provided for operating a measurement instrument that includes a tunable filter. The method comprises: (i) applying an output signal of an internal noise source of the measurement instrument to the input of the tunable filter, (ii) applying a control signal to the tunable filter to tune the tunable filter to a selected alignment frequency, (iii) measuring a value for a gain alignment parameter of the tunable filter while the output signal of the internal noise source is applied to the input of the tunable filter and the control signal is applied to the tunable filter, (iv) storing the measured gain alignment parameter value in an alignment table in the memory device, and (v) repeating steps (ii) through (iv) for a plurality of selected alignment frequencies in an operating frequency range of the tunable filter.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 8 shows a flowchart for one embodiment of a method of measuring a characteristic of a signal with a measurement instrument using alignment data.

FIG. 9 shows a flowchart for one embodiment of an alignment update procedure for a measurement instrument.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 4:
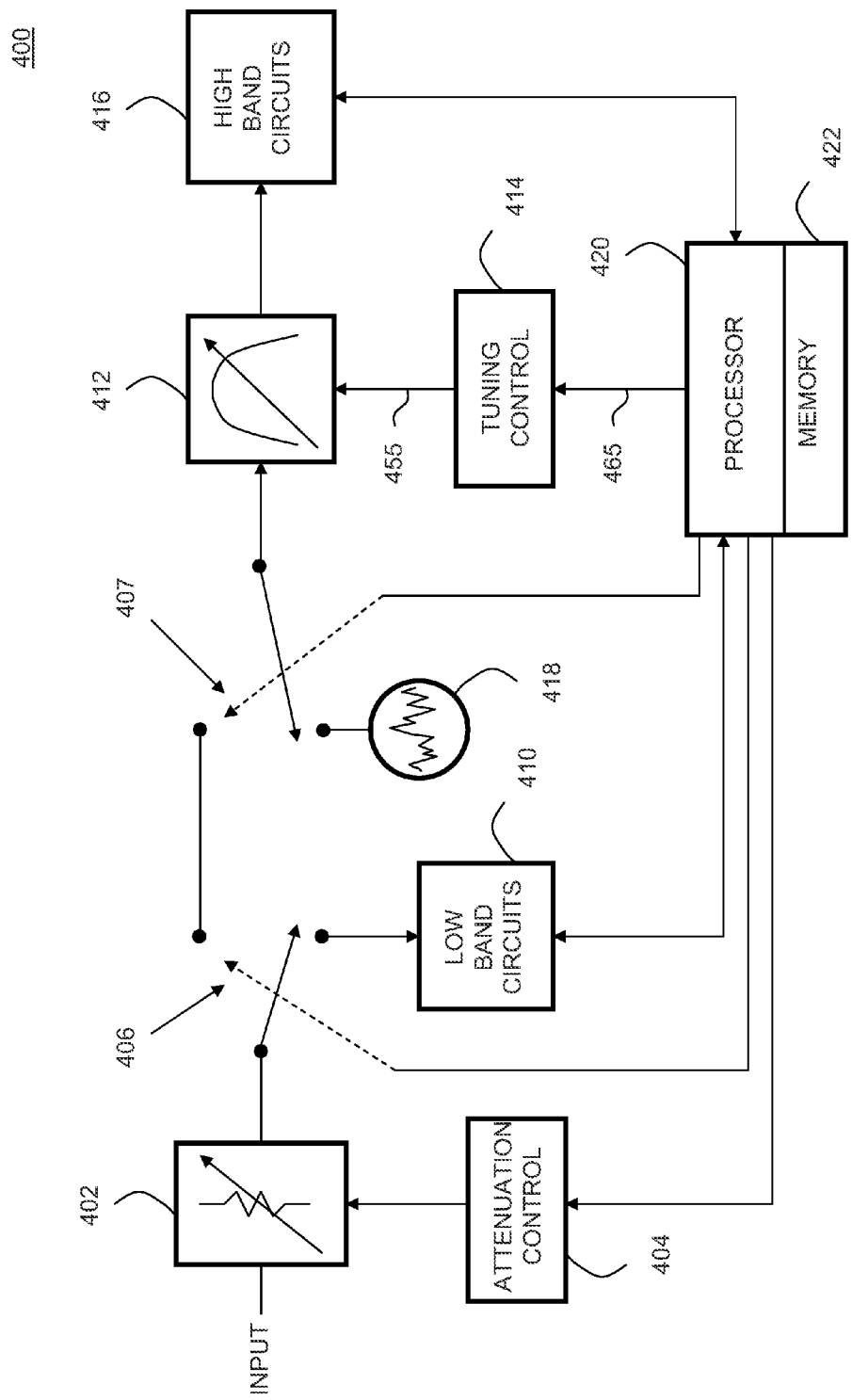
FIG. 4 shows a functional block diagram illustrating one embodiment of a front end section of a measurement instrument that can perform an alignment operation.

FIG. 4 shows a functional block diagram illustrating one embodiment of a front end section of a measurement instrument 400 that can perform an alignment operation. Measurement instrument 400 includes an adjustable input attenuator 402, an attenuation control 404, switches 406 and 407, low band circuits 410, a tunable filter 412, a tuning control 414, high band circuits 416, a noise source 418, a processor 420 and memory 422.

In an exemplary embodiment, measurement instrument 400 is a spectrum analyzer. To provide a concrete example and explanation, hereafter measurement instrument 400 will be referred to as spectrum analyzer 400. However, in general, principles described below may be applied to other measurement instruments that include tunable filters, such as network analyzers.

Low band circuits 410 and high band circuits 416 process signals at different ranges of frequencies. In one embodiment, for example, low band circuits 410 process "low frequency" signals having frequencies less than about 3.6 GHz, and high band circuits 416 process "high frequency" signals having frequencies from about 3.6 GHz to 26.5 GHz.

In one embodiment, for example, attenuation control 404 may operate in response to a user input that indicates a level of input attenuation to be applied corresponding to a signal level being applied to the input of spectrum analyzer 400.

In one embodiment, the functional blocks of attenuation control 404 and tuning control 414 may be incorporated with processor 420.

Switches 406 and 407 are operated under control of processor 420 to allow spectrum analyzer 400 to perform various operations. Switch 406 is operated to provide an externally-supplied signal received at the input of spectrum analyzer 400 to either low band circuits 410 or high band circuits 416 as required to analyze the particular signal. Switch control 406 may operate in response to a frequency selection made by a user to indicate a band of interest where a signal is to be measured. As will be described in greater detail below, switch 407 is operated to connect a noise signal output by noise source 418 to the input of tunable filter 412 during an alignment procedure for spectrum analyzer 400.

Figure 1:
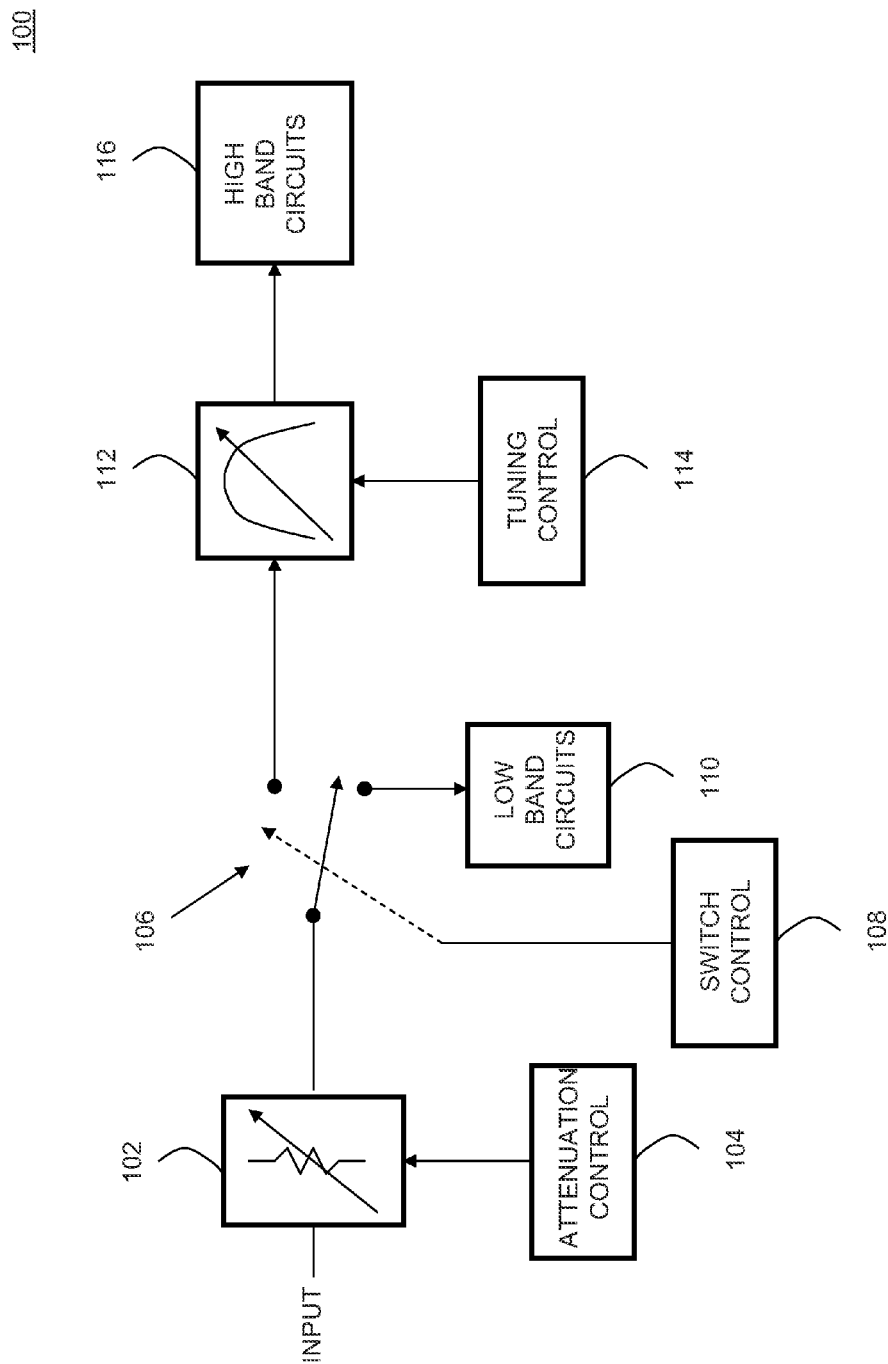
FIG. 1 shows a functional block diagram illustrating one embodiment of a front end section of a spectrum analyzer.
Figure 2:
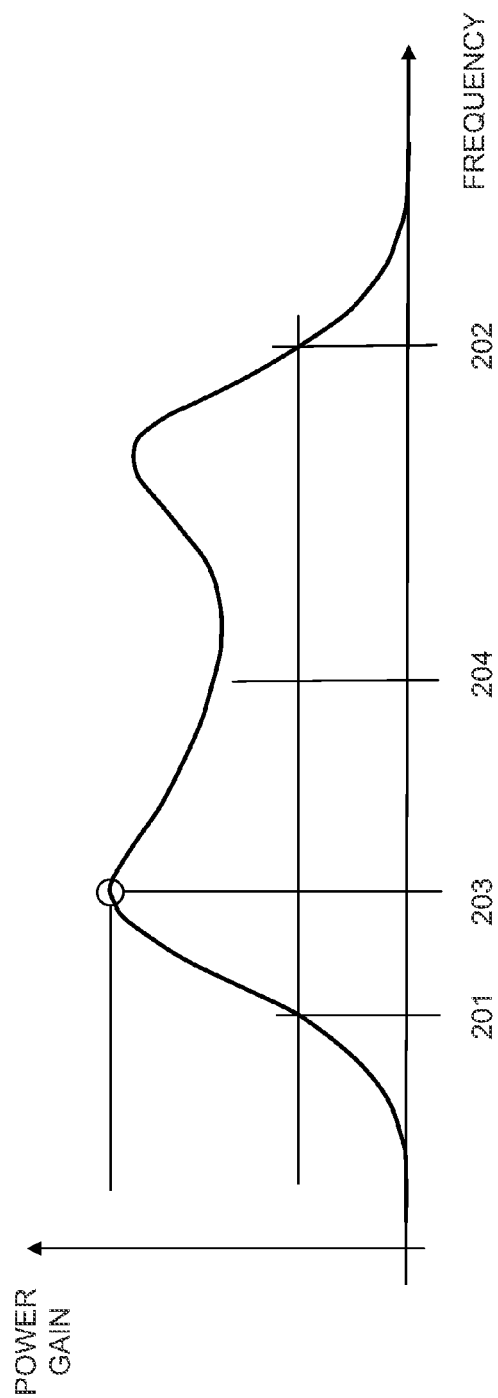
FIG. 2 shows an example of a passband frequency response of an yttrium-iron garnet (YIG) tuned filter (YTF).
Figure 3:
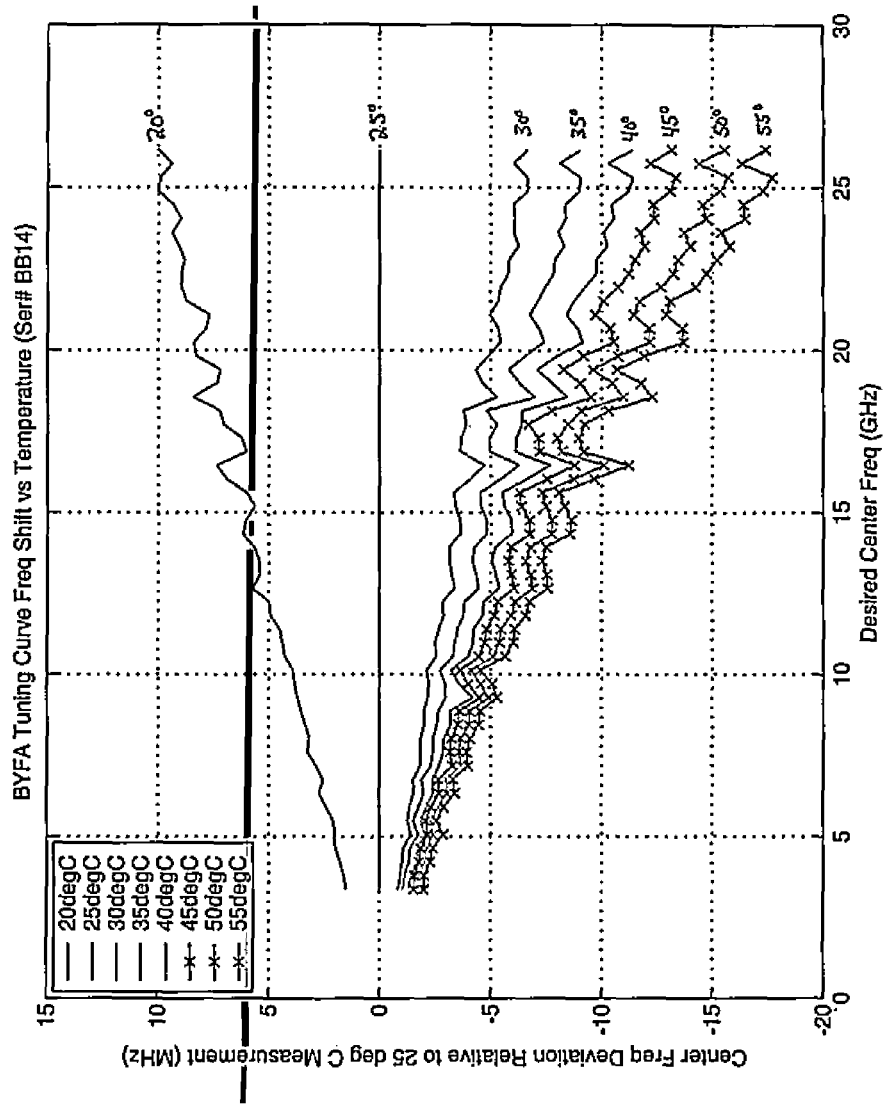
FIG. 3 illustrates some measured data that plots changes in center frequency versus current for one embodiment of an YTF as a function of temperature, and further function of operating frequency.

Tunable filter 412 has a tunable passband where signal loss is relatively low, while signals at frequencies outside the passband have a substantial loss, as illustrated in FIG. 2 above. Beneficially, the passband of tunable filter 412 is tunable across the frequency band of high band circuits 416 (e.g., from 3.6-26.5 GHz) in response to a control signal 455 supplied by tuning control 414.

Beneficially, tunable filter 412 may be an yttrium-iron-garnet (YIG) tuned filter (YTF). To provide a concrete example and explanation of an operation of spectrum analyzer 400, hereafter tunable filter 412 will be referred to as YTF 412. However, in general, principles described below may be applied to other tunable filters, with appropriate modifications to adapt to the peculiarities of the tuning response of the particular tunable filter.

In the case where tunable filter 412 is a YTF, then control signal 455 supplied by tuning control 414 is a tuning current 455 that tunes the frequency response of YTF 412. Typically, the tuning response of YTF 412 can be approximated to a first degree of approximation as being linear, following an equation:

$$F_C = m*I + b \qquad (1)$$

where $F_C$ is the frequency to which YTF 412 is tuned in response to a tuning current value I. However, in general the tuning response of YTF 412 is not perfectly linear, and so a frequency error or deviation will result if the tuning current is determined solely by reference to equation (1). In general, adjustments much be made to the tuning current value/that is applied to YTF 412 to tune it to a desired frequency $F_C$. Furthermore, as discussed above, the tuning characteristic of YTF 412 is known to vary with time and according to environmental factors including temperature—including in particular the temperature of the coupling loops in the YIG device of YTF 412. To produce high accuracy measurements, spectrum analyzer 400 employs various techniques to adjust the tuning current 455 applied to YTF 412 to counteract these effects, as will be described in greater detail below.

Tuning control 414 receives a digital control word 465 from processor 420 and produces therefrom control signal (e.g., a tuning current) 455 for tuning the frequency response of YTF 412. In one embodiment, tuning control 414 may include a digital-to-analog converter (DAC), and may convert digital control word 465 from processor 420 into an analog tuning current 455 whose magnitude varies in correspondence to the value of digital control word 465, as is known in the art. Of course other arrangements are also possible. In one embodiment, tuning control 414 may include a memory that may store data provided by processor 420.

Noise source 418 generates a broadband "white" noise signal that may be used in an alignment procedure for spectrum analyzer 400, as will be described in greater detail below.

In one embodiment, noise source 418 may comprise a microwave preamplifier. Beneficially, noise source 418 outputs a noise signal that approximates a flat "white noise" spectrum across the operating frequency range of high band circuits 416 and tunable filter 412. In practice, however, noise source 418 will not have a perfectly flat white noise spectrum, and so adjustments may be made to account for the amplitude variations, as will be described in greater detail below.

Processor 420 is configured to execute one or more software algorithms in conjunction with memory 422 to provide functionality for measurement instrument 400. In particular, processor 400 may execute programmable instructions to perform one or more steps described below with respect to the flowcharts of FIGS. 5-8. Beneficially, processor 420 includes its own memory (e.g., nonvolatile memory) for storing executable programming code that allows it to perform the various functions of measurement instrument 400. Alternatively, or additionally, executable code may be stored in designated memory locations within memory 422.

Memory 422 stores data and/or software programming code used in operations of measurement instrument 400.

Certain features of spectrum analyzer 400 will now become apparent from the description to follow of various operations that may be performed by spectrum analyzer 400.

Figure 5:
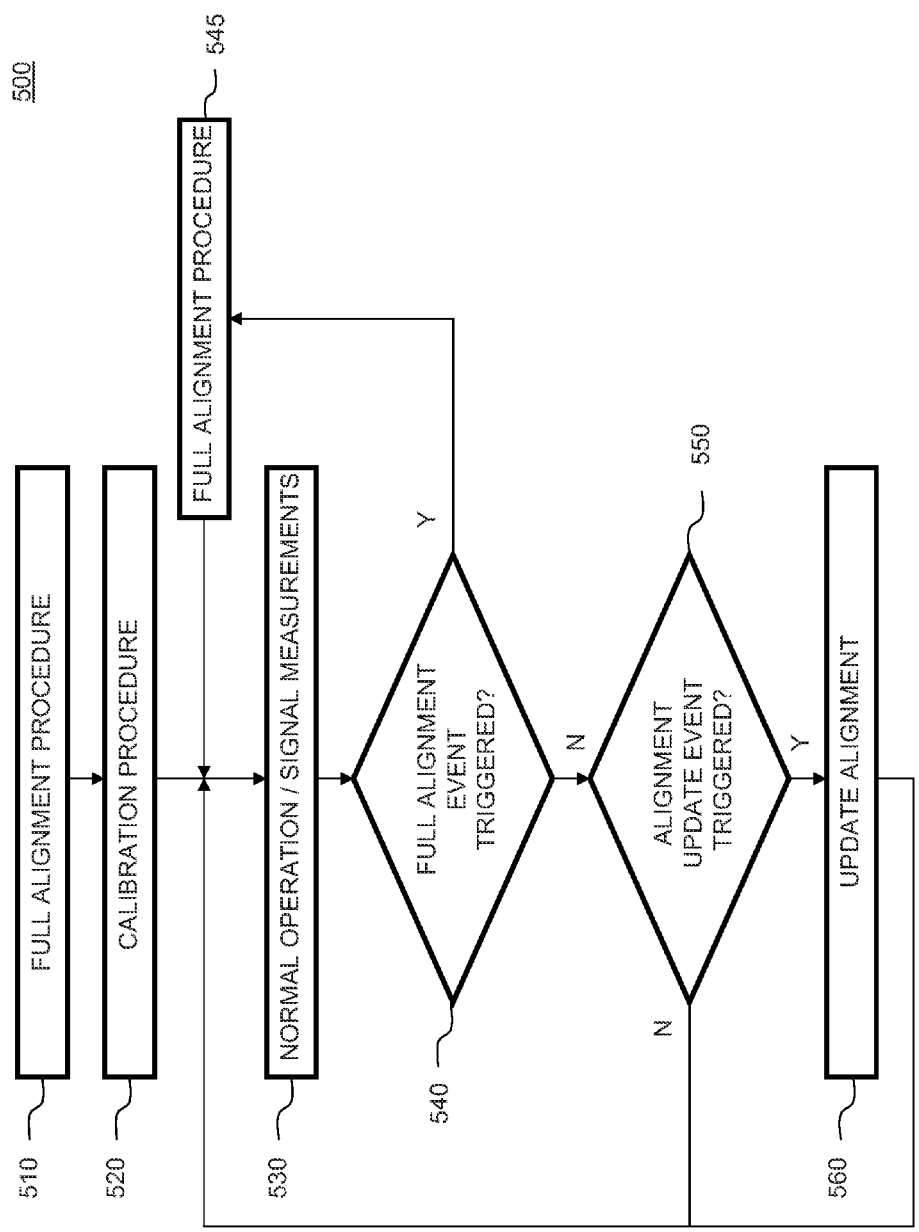
FIG. 5 shows a flowchart for one embodiment of a method of operating a measurement instrument.

FIG. 5 shows a flowchart for one embodiment of a method 500 of operating a measurement instrument, such as spectrum analyzer 400. In the discussion to follow, it is important to distinguish a calibration from an alignment. A calibration is the verification of instrument behavior using equipment that is external to the instrument and whose performance is traceable to known and accepted standards, such as the U.S.A.'s National Institute of Standards and Technology (NIST). In contrast, an alignment improves an instrument's performance by the internal process of measuring behavior using internal components and adjusting or compensating for the behavior measured. Note that for an operation to be an alignment, the references and the intelligence must not depend on any external equipment.

In the example embodiment, prior to normal operations spectrum analyzer 400 is initially aligned and calibrated. This may be done at a factory where spectrum analyzer 400 is manufactured prior to shipment, or at some other appropriate facility (e.g., a calibration laboratory) other than the factory. Beneficially, calibration is performed using equipment whose characteristics are precisely known, and traceable back to reference standards, such as standards from NIST.

An initial full alignment procedure 510 is performed to measure alignment parameters of YTF 412. An explanation of one embodiment of the alignment procedure 510 will now be described with respect to FIG. 6.

Figure 6:
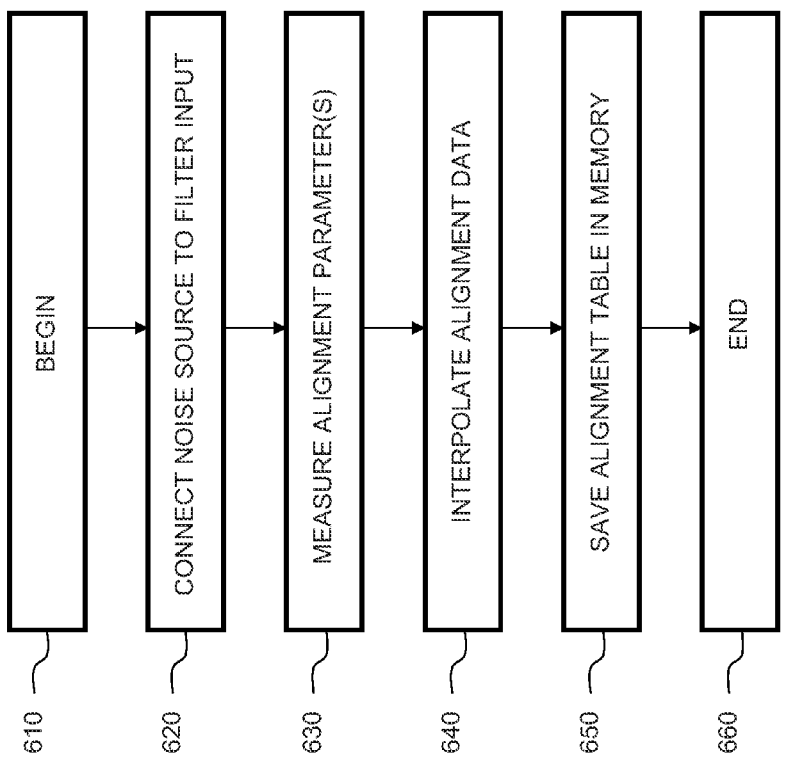
FIG. 6 shows a flowchart for one embodiment of an alignment procedure for a measurement instrument.

FIG. 6 shows a flowchart for one embodiment of an alignment procedure 600 for a measurement instrument, such a spectrum analyzer 400.

The alignment procedure 600 begins at step 610.

In a step 620, the output of internal noise source 418 is connected to the input of YTF 412 by means of switch 407 under control of processor 420. Beneficially, noise source 418 outputs a noise signal with a generally "white noise" spectrum across the operating frequencies of YTF 412 and high band circuits 416.

In a step 630, spectrum analyzer 400 measures one or more alignment parameters of YTF 412 at N (e.g., 128) selected alignment frequencies spanning the operating frequency range of YTF 412 and high band circuits 416. Table 1 below shows one embodiment of an alignment parameter vector, or alignment table entry, for YTF 412 that is measured at each of the N selected alignment frequencies by spectrum analyzer 400.

TABLE 1

| Element | Alignment Parameter | Example Values/Units |
|---|---|---|
| 1 | ΔFcenter | −1.13e7 (Hz) |
| 2 | GainCenter | +12.234 (dB) |
| 3 | ΔFpeak | −1.72e7 (Hz) |
| 4 | GainPeak | +13.170 (dB) |
| 5 | DateTimeAlignment | 20080723.1610 |

The alignment parameter vector of Table 1 includes at least two different types of alignment parameters: frequency alignment parameters and gain alignment parameters. Frequency alignment parameters pertain to frequency characteristics of YTF 412, while gain alignment parameters pertain to gain or amplitude characteristics of YTF 412. The various alignment parameters of Table 1 will now be explained in detail.

The ΔFcenter frequency alignment parameter represents the difference between the selected alignment frequency, and the measured center frequency of the passband of YTF 412 when a selected control signal (e.g., tuning current) 455 is applied to YTF 412 that should ideally (e.g., see Equation (1) above) tune YTF 412 to a corresponding selected alignment frequency. As explained above, since the tuning response of YTF 412 is not perfectly linear—and varies with temperature, age and other factors—in general the actual measured center frequency of the passband of YTF 412 will be different than the corresponding selected alignment frequency. Therefore, in general the selected tuning current 455 will only approximately tune YTF 412 to the selected alignment frequency, with the frequency difference or error being represented by ΔFcenter. A variety of algorithms may be employed to determine the frequency parameter ΔFcenter. A detailed description of one embodiment of such an algorithm will be described below with respect to FIG. 7.

The GainCenter gain alignment parameter represents the measured gain of YTF 412 at the measured center frequency.

The ΔFpeak frequency alignment parameter represents the difference between the selected alignment frequency, and the measured peak frequency of YTF 412 when a selected control signal (e.g., tuning current) 455 is applied to the YTF that should ideally tune YTF 412 to the selected alignment frequency. As shown in FIG. 2 and described above, in general the peak frequency 203 will be different than the center frequency 204 in the passband of YTF 412. Thus, in one embodiment, during the alignment procedure 600, spectrum analyzer 400 measures the peak frequency 203 for each of the N selected alignment frequencies.

The GainPeak gain alignment parameter represents the measured gain YTF 412 at the measured peak frequency.

The DateTimeAlignment alignment parameter represents the day and time when the alignment measurements of the corresponding alignment parameter vector was measured. The time information may be used to determine when the alignment data is stale and a new alignment procedure 550 should be performed. As explained in greater detail with respect to FIG. 8 below, the time information also may be used in an algorithm to determine a "tuning domain" (selection of peak-frequency-tuning versus centering-frequency-tuning) which is to be applied for tuning YTF 412 for a specific measurement by spectrum analyzer 400.

Further details of one embodiment of a step 630 of measuring one or more alignment parameters of YTF 412 will be described in greater detail below with respect to FIG. 7.

Processor 420 creates an alignment table for storing the alignment parameter values measured at the N selected alignment frequencies. In one embodiment, the alignment table has M alignment entries where M>N. For example, in one embodiment N=128 and M=2360. In step 640, processor 420 performs interpolation to generate the remaining M-N (e.g., 2232) entries in the alignment table. Table 2 below shows one embodiment of an alignment table for YTF 412 that is created by spectrum analyzer 400.

TABLE 2

| Element Number | Frequency, GHz | Tuning Δf (Center) | Gain, dB (Center) | Tuning Δf (Peak) | Gain, dB (Peak) | Time (standard format) |
|---|---|---|---|---|---|---|
| 0 | 3.40 | | | | | |
| 1 | 3.41 | | | | | |
| 2 | 3.42 | | | | | |
| 3 | 3.43 | | | | | |
| 4 | 3.44 | | | | | |
| 5 | 3.45 | | | | | |
| ... | | | | | | |
| 2360 | 27.00 | | | | | |

Beneficially, processor 420 may execute different interpolation algorithms for different alignment parameters in the alignment table. One exemplary embodiment of an interpolation procedure 640 will now be explained in detail.

In the example embodiment, to interpolate the frequency parameters below the lowest selected alignment frequency that was measured in the alignment procedure at step 630, processor 420 copies the values for the table entry for the lowest selected alignment frequency into all the table entry locations below it, for both the center frequency and peak frequency parameters ΔFcenter and ΔFpeak. In the exemplary embodiment, interpolating above the highest selected alignment frequency is not required. To interpolate the center frequency parameter ΔFcenter between any two selected (measured) alignment frequencies, processor 420 employs a linear interpolation based on frequency. To interpolate the peak frequency parameter ΔFpeak between any two selected alignment frequencies, processor 420 employs a zero-order interpolation based on frequency. This means that processor 420 chooses the value for the peak frequency parameter ΔFpeak for each table entry between any two selected (measured) alignment frequencies by choosing the peak frequency value for the entry whose selected alignment frequency is closer. For example, if 3.60 GHz is one selected (measured) alignment frequency, and 3.96 GHz is another selected (measured) alignment frequency, then processor 420 fills the entries for 3.61, 3.62, etc., through 3.78 GHz with the value of the peak frequency parameter ΔFpeak from the 3.6 GHz entry, and fills the entries for 3.78, 3.79, 3.80, etc., though 3.95 GHz with the value of the peak frequency parameter ΔFpeak from the 3.96 GHz entry.

In the example embodiment, for the GainCenter parameter, processor 420 uses the same combination of extension techniques outside the alignment measurement range, and linear interpolation between measured values, as are used for the center frequency parameter ΔFcenter. For the gain-at-the-peak column, processor 420 uses the same combination of extension techniques outside the range, and zero-order interpolation between elements, as used for the peak frequency parameter ΔFpeak.

In the example embodiment, processor 420 sets value of the time parameter for all interpolated rows in the alignment table to 10 hours before the current time. This feature provides certain benefits in an algorithm to determine a "tuning domain" which is to be applied for tuning YTF 412 during normal operations or measurements by spectrum analyzer 400, as will be explained below with respect to FIG. 8.

It should be understood that the above description of interpolation procedure 640 is only one exemplary embodiment and has been provided to facilitate understanding of alignment procedure 600 through a beneficial concrete example. Other interpolation procedures may be employed in other embodiments of the disclosed alignment procedure 600.

In step 650, the alignment table including the interpolated alignment data is saved into a memory (e.g., memory 422, or a memory in tuning control 414) of spectrum analyzer 400.

After the alignment table has been created and populated by processor 420, then alignment procedure 600 ends at step 660.

Turning back again to FIG. 5, alignment procedure 510 produces an alignment table with alignment data which may be used during normal operations of spectrum analyzer 400 when making a measurement of an externally-supplied signal to compensate for tuning drift and changes for YTF 412 over time.

However, as noted above, the alignment table is generated using internal noise source 418, rather than an externally-supplied signal connected to the input of spectrum analyzer 400. In general, the path loss for the path from the input of spectrum analyzer 400 to the input of YTF 412 will be different than the path loss for the path from the output of noise source 418 to the input of YTF 412. So when an externally-supplied signal is to be measured, there is a path loss difference which should be compensated. Furthermore, in general the alignment table is generated from internal noise source 418 that does not have a perfectly flat white noise spectrum. Again, when measuring an actual externally-supplied signal this will produce a measurement error that should be compensated. Accordingly, after the alignment procedure 510 is completed, in one embodiment a calibration procedure 520 is performed on spectrum analyzer 400 that includes making measurements to compensate for one or both of these factors.

In one embodiment of the calibration procedure 520, a signal generator having a calibrated frequency and amplitude output is provided to the input of spectrum analyzer 400. The frequency of the signal generator is adjusted to K different calibration frequencies spanning the operating frequency band of YTF 412 and high band circuits 416. Of interest, during the calibration procedure, processor 420 applies digital control words 465 to tuning control 414 which produces therefrom control signal (e.g., a tuning current) 455 for tuning YTF 412 to each calibration frequency in turn. At each calibration frequency, spectrum analyzer measures a gain calibration parameter value. The gain calibration parameter value can be used during a normal measurement of an externally-supplied signal by spectrum analyzer 400 to compensate a gain alignment parameter value for the factors described above to produce a more accurate measurement of the externally-supplied signal.

In one embodiment, during the calibration procedure, spectrum analyzer 400 creates a calibration table that includes K sets of calibration data for YTF 412 for K different calibration frequencies spanning the operating frequency range of YTF 412 and high band circuits 416. In one embodiment, the calibration table is stored in memory 422. In an alternate arrangement, the calibration table is stored in a memory included in tuning control 414. If more accurate compensation is desired, then compensation at operating frequencies in between the K calibration frequencies may be accomplished by interpolation of the K calibration samples. Beneficially, the selection of K is a tradeoff between being so large as to require a long calibration time, and being too small that the calibration data cannot provide sufficiently accurate compensation for all operating frequencies in the operating frequency band of YTF 412 and high band circuits 416.

In step 530, spectrum analyzer 400 is used for normal operations and measurements. In normal operation, spectrum analyzer 400 may measure a characteristic (e.g., power level) of an externally-supplied signal applied to the input of spectrum analyzer 400. In that case, when it is desired to tune YTF 412 to a specific operating frequency for making the measurement, the previously-created alignment table is employed to determine the tuning current to be applied to YTF 412 to tune it to the specific operating frequency. In one embodiment, frequency alignment data from the alignment table may be employed to generate the tuning current 455 for tuning YTF 412 to the specific operating frequency. In one embodiment, the alignment table may be employed by processor 420 to determine a digital control word 465 that is sent to tuning control 414 for generating (e.g., via a DAC) tuning current 455 for tuning YTF 412. In another embodiment, the alignment table may be employed by tuning control 414 to determine an offset to be added to digital control word 465 that is received by tuning control 414 for generating (e.g., via a DAC) tuning current 455 for tuning YTF 412.

Beneficially, when measuring the characteristic (e.g., power level) of the externally-supplied signal, spectrum analyzer 400 employs a correction factor that is determined from one of the gain alignment parameter values in the alignment table. In one embodiment, spectrum analyzer 400 also employs a gain calibration parameter value that corrects for at least one of: (1) an amplitude variation in the noise signal as a function of frequency; and (2) a difference between: (a) a path loss for a path from the input of spectrum analyzer 400 to the input of YTF 412; and (b) a path loss for a path from an output of internal noise source 418 to the input of YTF 412.

Further details of normal operations or measurements in step 530 will be described in greater detail below with respect to FIG. 8.

In step 540 it is determined whether a full alignment event is triggered. If so, then in a step 545 a new full alignment procedure is performed. The full alignment procedure in step 545 may be the same as the full alignment procedure in step 510. However, beneficially, the full alignment procedure 545 may not require a subsequent calibration step 520, as the calibration parameters obtained in step 520 may still be valid, since, in general, they may change significantly more slowly with time than the alignment parameters for YTF 412. In one embodiment, a full alignment event may be triggered automatically whenever a specified time period (e.g., 6 months; 12 months) has elapsed since the last full alignment procedure 510 was performed. In one embodiment, a full alignment event may be triggered when one or more internal measurements of spectrum analyzer 400 indicate that spectrum analyzer 400 is no longer operating within its performance specifications. Beneficially, periodically (e.g., every two years) spectrum analyzer 400 may be fully aligned and calibrated by repeating the entire method 500, including full alignment 510 and calibration 520.

Otherwise, in a step 550, it is determined whether an alignment update event is triggered. If not, then normal operations and signal measurements by the spectrum analyzer continue at step 530.

In one embodiment, an alignment update event may be triggered automatically whenever spectrum analyzer 400 is turned off. In another embodiment, an alignment update event may be triggered in response to a user depressing a button on a user interface (e.g. front panel) of spectrum analyzer 400, indicating a request for an alignment at a specific frequency to which spectrum analyzer is currently centered. In yet another embodiment, an alignment update event may be triggered in response to a remote command received by spectrum analyzer 400 over a control interface of spectrum analyzer 400.

In one beneficial embodiment, an alignment update event may be triggered in response to a determination by processor 420 that one or more alignment parameter values in the alignment table is stale, either due to its age, or due to the tuning history of tunable filter 412 since the last alignment, or some combination thereof. Beneficially, processor 420 has access to a thermal model of YTF 412 stored in a memory of spectrum analyzer 400. The thermal model may employ an equation or table that relates frequencies, durations and/or the number of times that YTF 412 is tuned to changes in the internal temperature of YTF 412. In one embodiment, processor 420 triggers an alignment event when it determines, using the thermal model, that the absolute value of the difference between the current temperature of YTF 412 and the temperature of YTF 412 when it was last aligned exceeds an Alignment Expiration Temperature Change Threshold (e.g., 2.5° C.).

In some embodiments, two or more of the factors discussed above may be combined to trigger an alignment update event. For example, when an alignment parameter value is determined to be stale, then an alignment update event may be triggered the next time that spectrum analyzer 400 is turned off. Other triggering events are possible.

If an alignment event is triggered, then an alignment update procedure is performed at step 560. Further details of one embodiment of an alignment update procedure 560 will be described in greater detail below with respect to FIG. 9.

After the alignment update 560 is completed, then spectrum analyzer 400 returns to normal operation and signal measurements at step 530.

Figure 7:
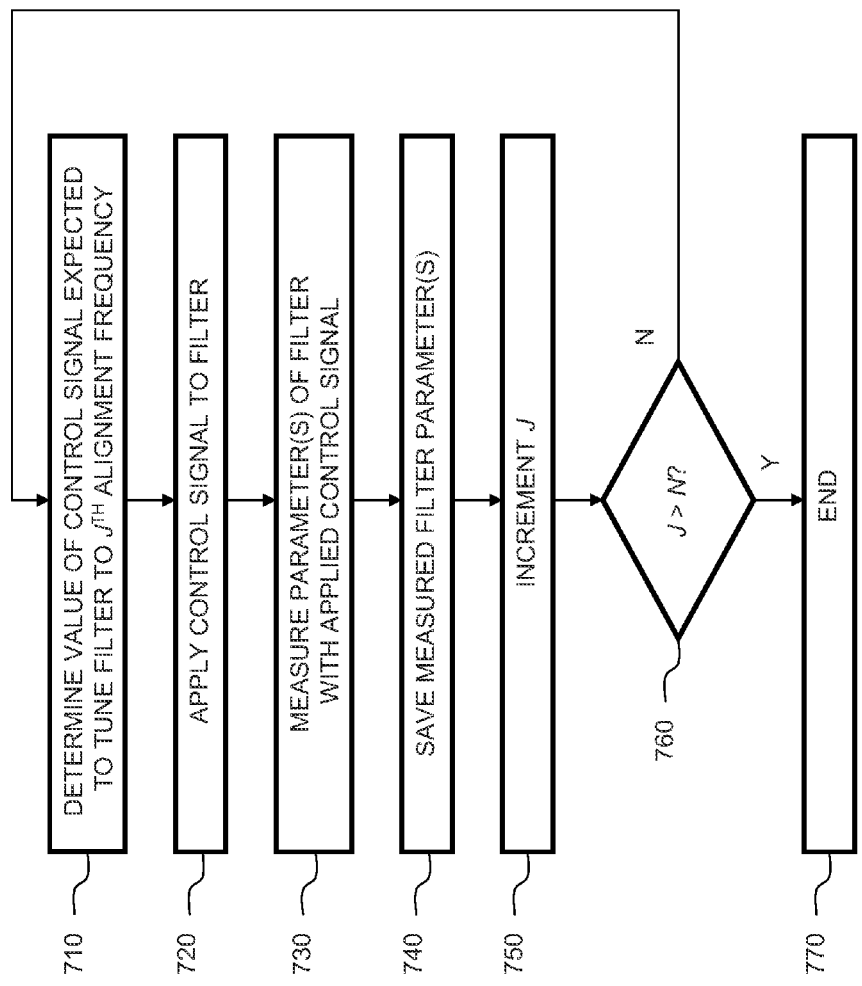
FIG. 7 shows a flowchart for one embodiment of a method of measuring filter parameters in an alignment procedure.

FIG. 7 shows a flowchart for one embodiment of a method 700 of measuring alignment parameters for YTF 412 in an alignment procedure such in step 630 of alignment procedure 600 shown in FIG. 6.

In a first step 710, processor 420 determines a value of control signal (e.g., tuning current) 455 that should approximately tune YTF 412 to a $J^{TH}$ selected alignment frequency, where the index J∈(1,N). In one particular embodiment, processor 420 determines a value for digital codeword 465 that should ideally cause tuning control 414 to tune YTF 412 to the selected alignment frequency. In one embodiment, processor 420 may determine digital codeword 465 from a linear approximation of a tuning curve, such as using equation (1) above. In one embodiment, processor 420 may further employ alignment values from an alignment table in spectrum analyzer 400 to determine the value to digital codeword 465. In another embodiment, tuning control 414 may employ alignment values from an alignment table in spectrum analyzer 400 to determine the tuning current 455 that is generated in response to digital codeword 465.

In step 720, the control signal (e.g., tuning current) 455 is applied to YTF 412 to tune YTF 412 (approximately) to the $J^{TH}$ selected alignment frequency. At this time, as discussed above with respect to FIG. 6, and particularly step 610, the output of internal noise source 412 is applied to the input of YTF 412. Beneficially, no other signal is applied to the input of YTF 412 at this time.

In a step 730, one or more alignment parameters are measured for YTF 412 at the $J^{TH}$ selected alignment frequency.

In one embodiment, the alignment parameters may comprise the alignment vector shown in Table 1 above. A more detailed description will now be provided of one embodiment of measuring the alignment parameters of Table 1.

In the exemplary embodiment, spectrum analyzer 400 determines the alignment parameters by making a sweep measurement. In this measurement, spectrum analyzer 400 is set up so as to measure the average power of the noise spectrum of noise generator 418, as passed through YTF 412, using an average detector in spectrum analyzer 400. In this exemplary embodiment, the resolution bandwidth of spectrum analyzer 400 is set to an appropriate value (e.g., 3 MHz). A local oscillator (LO) in high band circuits 416 is swept across a suitable span with the tuning current 455 set to the constant (i.e. not tuning with the LO) value that ideally would tune YTF 412 to a selected alignment frequency in the center of the span. In one embodiment, the span is set to about 2.5 times the expected passband bandwidth of YTF 412 at the selected alignment frequency. In one embodiment, parameters for determining the expected passband bandwidth of YTF 412 may be found in an alignment file in spectrum analyzer 400. In one embodiment, this produces a span in a range of 200 MHz.

Spectrum analyzer 400 creates a measurement trace that covers this span by measuring the power levels for L power detection buckets or "elements" (e.g., L=250). In one embodiment, spectrum analyzer 400 sets the sweep time to 50 ms to get acceptable smoothing from the average detector without excessive duration.

However, even with 50 ms sweep times, the measurement of noise gives noisy results.

Accordingly, in one embodiment smoothing is employed to trade off some average accuracy of the gain measurements and tuning current estimates in order to improve the repeatability of the measurements. It is expected that optimum smoothing occurs with a smoothing function with a half-power width of seven elements. Accordingly, spectrum analyzer 400 creates a raised cosine smoothing function with elements numbered from −6 through +6. Each element is weighted by a value proportional to a raised cosine, scaled so that the sum is unity. Table 3 illustrates values for such a raised-cosine weighting.

TABLE 3

Cosine Weighting Factor Table

| Element Number | Value |
| --- | --- |
| −6 | 0.00707 |
| −5 | 0.02689 |
| −4 | 0.05553 |
| −3 | 0.08732 |
| −2 | 0.11596 |
| −1 | 0.13578 |
| 0 | 0.14286 |
| 1 | 0.13578 |
| 2 | 0.11596 |
| 3 | 0.08732 |
| 4 | 0.05553 |
| 5 | 0.02689 |
| 6 | 0.00707 |

To smooth the L-element data set, the measured power level for each element is convolved with the raised cosine values of Table 3. For the convolution, the value for each new element n is produced from the sum of the products of element values and weighting values, over the range of elements from n−6 through n+6 inclusive, with weighting values from the table entries indexed by −6 through +6 inclusive and respectively.

To determine the center frequency of YTF 412, the L-element data set is then sorted in order by the power levels of the various elements. A power level, Px, is found that is the $x^{TH}$ percentile below the maximum power level, where x is some number that is expected to be on the skirt of the filter. An example value for x would be 0.40. The number, Nx, of elements with power levels greater than Px is x times the total number of elements. Thus, in the given example for x=0.40 and L=250 elements, Nx=100. So Px is the power for the element with the 100th highest power level.

Then, the unsorted element array is inspected for the 25th percentile of the elements having values greater than Px. In other words, the number of elements from left to right that have power levels greater than Px is counted until the count reaches 0.25 Nx. The frequency that corresponds to this twenty-fifth percentile element is referred to here as the left-of-center frequency. The process is repeated for the 75th percentile, with the result being referred to here as the right-of-center frequency. The mean of the left-of-center frequency and the right-of-center frequency is denoted as a first-iteration center frequency.

Then, the noise floor is estimated and subtracted-away to provide the desired accuracy of the algorithm in extreme conditions where the output level of the noise signal produced by internal noise source 418 is not adequately in excess of the input noise of the analyzer.

The impact of the passband shape on an estimate of the noise floor is significant at the edges of the passband, but drops off rapidly outside the passband. Therefore, the algorithm "blocks out" a portion of the trace centered at the computed first-iteration center frequency element, with a width of 1.5 times the expected passband bandwidth, which in the given example would be 150 of the 250 elements.

Thus, the noise floor is estimated by taking the average of the power levels over all qualified elements. In the given example of L=250 elements, a qualified element is one that is either below the computed first-iteration center by at least 75 elements or above the center by at least 75 elements. If the computed first-iteration center is between elements numbered 75 and 175, this will be the average over 100 elements. If the computed first-iteration center is outside this range, the number of elements averaged can be higher than 100. In that case, the average is computed by dividing the accumulated sum by the number of elements in that sum, rather than by a fixed value of 100.

The noise level found by this method is then subtracted from the measured power values of each of the L elements to produce adjusted power values for the L elements.

Then the previous center-finding operation is repeated using the adjusted values for the sweep elements, only this time, Px is set to 4.5 dB below the peak power level (in other words, the peak value is multiplied by a factor of 0.35), and the 5th and 95th percentiles are used, instead of the 25th and $75^{th}$ percentiles, for computing the left-of-center and right-of-center frequencies. The mean of the left-of-center frequency and the right-of-center frequency is defined to be the center frequency of YTF 412. The difference between the center frequency and the ideal center frequency is the center frequency parameter ΔFcenter, representing the tuning error of YTF 412.

The measured power level at the element determined to be the center frequency element is employed to determine the GainCenter gain alignment parameter by subtracting out the nominal noise power.

The highest amplitude element in the data set is the peak frequency element. The difference between the peak frequency and the ideal center frequency is the peak frequency parameter ΔFpeak.

The measured power level at the element determined to be the peak frequency element is employed to determine the GainPeak gain alignment parameter by subtracting out the nominal noise power.

In a step 740, the alignment vector for the selected alignment frequency J is saved in a corresponding entry in the alignment table. In one embodiment, processor 420 rounds the selected alignment frequency to the nearest 10 MHz and enters the corresponding alignment vector at the entry corresponding to that frequency in the alignment table.

In a step 750, the index J is incremented.

In a step 760, the index J is compared to the number of selected alignment frequencies to be measured, N.

If J≦N, then the process repeats at step 710 using the incremented value of J.

If J>N, then the process ends at step 770.

FIG. 8 shows a flowchart for one embodiment of a method 800 of measuring a characteristic of a signal with a measurement instrument using alignment data.

In a step 810, the measurement process begins. To begin the process, a user may: connect an externally-supplied signal to be measured to the input of spectrum analyzer 400; select an operating frequency; set a frequency span and other relevant measurement parameters for operating spectrum analyzer 400.

In a step 820, spectrum analyzer 400 selects an alignment vector or entry from the alignment table to be used to determine a control signal (e.g., tuning current) 455 to be applied to YTF 412 to tune it to the desired operating frequency.

In one embodiment, spectrum analyzer 400 will not necessarily use the alignment table entry from the frequency that is closest to the desired operating frequency. Instead, in such an embodiment spectrum analyzer 400 evaluates each table entry within ±Y MHz (e.g., 200 MHz) of the desired operating frequency and picks the best one. Beneficially, the range±Y MHz is set to ensure that there is always one actually measured (non-interpolated) alignment vector within the range. The best table entry is defined to be the one with the smallest product of adjusted-age and adjusted frequency difference. Adjusted-age is the time between the current time and the time the array element was stored, offset by a predetermined time interval (e.g., 20 seconds). The adjusted difference frequency is Z MHz (e.g., 30 MHz) plus the absolute value of the difference between the desired operating frequency and the array element frequency. It is noted that if the time difference were not "adjusted," a very recent alignment entry would always be chosen over an alignment entry that is quite recent and much closer in frequency to the desired operating frequency. Similarly, if the frequency difference was not adjusted, an alignment entry with zero frequency difference would always be chosen over one a mere 10 MHz away and 100 times more recent.

In a step 830, spectrum analyzer 400 determines a tuning domain for tuning YTF 412 to a desired operating frequency for making a desired measurement. In one embodiment, spectrum analyzer 400 may operate in one of two YTF tuning domains: (1) tuning YTF 412 to locate its peak frequency at the desired operating frequency; and (2) tuning YTF 412 to locate its center frequency at the desired operating frequency. The advantage of operating in the first domain is that the amplitude sensitivity to frequency change or error in the tuning response of YTF 412 is at its lowest at the peak frequency. However, in general the peak frequency may be nearer than the center frequency to the edges of the passband of YTF 412. Therefore, when the tuning response of YTF 412 changes over time, it is possible that when YTF 412 is tuned with a tuning current that supposedly tunes it to its peak frequency, in actuality the operating frequency will be located on a skirt of the passband of YTF 412, rather than at the peak frequency. In other words, tuning YTF 412 to the center frequency is more robust than tuning to the peak frequency.

Accordingly, in one embodiment, spectrum analyzer 400 establishes peak frequency validity criteria for deciding whether to tune YTF 412 to the peak frequency or to the center frequency when making a signal measurement.

In one exemplary embodiment, spectrum analyzer 400 uses the peak frequency when the alignment data is recent enough and the history of tuning is benign enough that the robustness of tuning that is optimized by the centering process is not needed. The accuracy with which YTF 412 is tuned in frequency determines whether spectrum analyzer 400 can profit from peak tuning or must use centering for adequate robustness. In one embodiment, spectrum analyzer 400 applies a validity test to determine whether the peak frequency value in the alignment table is appropriate for use. In one embodiment, the validity test includes several threshold tests. If all of these threshold tests are met, then spectrum analyzer 400 uses the peak frequency. Otherwise, spectrum analyzer 400 uses the center frequency. The numeric thresholds used in these threshold tests may be stored in a design parameters file in memory in spectrum analyzer 400.

In one embodiment of a threshold test, the peak frequency is only used if the chosen alignment vector from the alignment table is more recent than an "Alignment Age Limit" threshold.

In another embodiment of a threshold test, the peak frequency is only used if the product of the age of the chosen alignment vector from the alignment table, and the frequency difference between the operating frequency and the peak frequency parameter is less than an age/frequency-difference product threshold.

In yet another embodiment of a threshold test, the peak frequency is only used if an internal temperature change of YTF 412 between the current time a measurement is being made, and a time when the peak frequency parameter was measured produces a tuning uncertainty that is less than a predetermined Tuning Uncertainty Threshold. Beneficially, to perform this test, spectrum analyzer 400 employs a thermal model of YTF 412 to determine the tuning uncertainty, in similarity to the explanation provided above with respect to step 540 in FIG. 5. Beneficially, the thermal model may estimate changes to the tuning response of YTF 412 that are produced in response to heat generated by current levels applied to the coils in the YTF 412 during the tuning history of YTF 412.

Other threshold tests may be employed in addition to, or in place of, one or more of the threshold tests described above.

In a step 840 the operating tuning current is determined.

In a step 850 the operating tuning current applied to YTF 412.

In a step 860, spectrum analyzer 400 measures one or more characteristics (e.g., power level) of the externally-supplied signal with YTF 412 tuned to the desired operating frequency by the operating tuning current. Beneficially, spectrum analyzer 400 adjusts the measured value in step 870 by a correction factor that is determined from one of the gain alignment parameter values in the alignment table. Beneficially, the gain alignment parameter value is selected from the alignment vector or entry from the alignment table that was selected to determine the tuning current for YTF 412. Beneficially, the gain alignment parameter value that is selected depends upon the tuning domain that is employed for tuning YTF 412. That is, when spectrum analyzer 400 operates in the peak frequency tuning domain, then spectrum analyzer 400 employs the GainPeak alignment parameter value for determining the correction factor, and when spectrum analyzer 400 operates in the center frequency tuning domain, then spectrum analyzer 400 employs the GainCenter alignment parameter value for determining the correction factor.

In a step 880, the process ends.

FIG. 9 shows a flowchart for one embodiment of a method 900 of updating one or more alignment parameter values in an alignment table of spectrum analyzer 400, such as may be performed in step 560 in method 500 illustrated in FIG. 5 above.

The alignment update procedure begins in step 910, typically in response to a triggering event as discussed above with respect to FIG. 5.

In a step 920, the output of internal noise source 418 is connected to the input of YTF 412 by means of switch 407 under control of processor 420.

In a step 930, spectrum analyzer 400 tunes YTF 400 to a frequency where alignment is to be performed.

In one case, the update alignment procedure 900 may be a single frequency alignment update. In that case, in one embodiment the alignment frequency may be a center frequency selected by a user via a user interface (e.g. front panel) of spectrum analyzer 400 when the user indicates a request for an alignment update. In another embodiment, the alignment frequency for the single frequency alignment update may be received by spectrum analyzer 400 from a remote processor or other instrument over a control interface of spectrum analyzer 400.

In another case, the update alignment procedure 900 may be an "end point" alignment update. In that case, beneficially the alignment update is performed at two frequencies: a first frequency near the lower end of the operating frequency band of YTF 412, and a second frequency near the upper end of the operating frequency band of YTF 412. Beneficially, the end point frequencies may be automatically selected by spectrum analyzer 400 without user input. Beneficially, alignment parameters at these two end point frequencies may be used to determine the slope "m" and intercept "b" in equation (1) above.

Other alignment updates are possible.

Once the selected alignment frequency is determined, spectrum analyzer tunes YTF 412 to the selected alignment frequency in a similar manner to that explained above with respect to FIG. 7.

In a step 940, spectrum analyzer 400 measures new values for the alignment parameters (e.g., Table 1, above) of the alignment table for the entry corresponding to the selected alignment frequency.

In a step 950, spectrum analyzer 400 writes the new measured values for the alignment parameters into the alignment table, including a new value for the DateTimeAlignment alignment parameter. Beneficially, during the alignment update the other alignment parameter values for other entries or rows in the alignment table that are not being updated are left intact.

In a step 960, spectrum analyzer 400 determines if there are more alignment frequencies whose alignment parameter values are to be updated (e.g., during an "end point" alignment update). If so, then the process returns to step 930.

Otherwise, the alignment update procedure ends at step 970.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method of operating a spectrum analyzer having an yttrium-iron garnet (YIG) tuned filter (YTF), an internal noise source, and a memory device, the method comprising:
   performing an alignment of a tuning response of the YTF, the alignment comprising,
   (i) applying a noise signal generated by the internal noise source of the spectrum analyzer to the input of the YTF,
   (ii) applying a tuning current to the YTF to tune the YTF to a selected alignment frequency,
   (iii) measuring a value of a gain alignment parameter of the YTF while the noise signal is applied to the input of the YTF and the tuning current is applied to the YTF,
   (iv) storing the measured gain alignment parameter value in an alignment table in the memory device, and
   (v) repeating steps (ii) through (iv) for a plurality (N) of selected alignment frequencies in an operating frequency range of the YTF;
   receiving an externally-supplied signal at an input of the spectrum analyzer;
   tuning the YTF to an operating frequency for measuring a characteristic of the externally-supplied signal; and
   measuring the characteristic of the externally-supplied signal at the operating frequency using the YTF and a correction factor that is determined from one of the gain alignment parameter values in the alignment table.

2. The method of claim 1, wherein measuring the characteristic of the externally-supplied signal at the operating frequency includes using a second correction factor that corrects for at least one of: (1) an amplitude variation in the noise signal as a function of frequency; and (2) a difference between: (a) a path loss for a path from the input of the spectrum analyzer to the input of the YTF, and (b) a path loss for a path from an output of the noise source to the input of the YTF.

3. The method of claim 1, wherein the alignment table has M entries, where M>N, further comprising interpolating values for the at least one gain alignment parameter for at least some of the M-N entries in the alignment table from the N measured values of the gain alignment parameter.

4. The method of claim 1, further comprising:
   in response to a triggering event, updating P entries in the alignment table, said updating comprising:
   (vi) applying the noise signal generated by the internal noise source of the spectrum analyzer to the input of the YTF,
   (vii) applying a tuning current to the YTF to tune the YTF to a selected alignment frequency,
   (viii) measuring a new value of the gain alignment parameter of the YTF while the noise signal is applied to the input of the YTF and the tuning current is applied to the YTF,
   (ix) storing the new measured gain alignment parameter value in the alignment table in the memory device, and
   (x) repeating steps (vi) through (ix) for P selected alignment frequencies in an operating frequency range of the tunable filter, where P<N.

5. The method of claim 4, wherein the triggering event is a determination that an absolute value of a difference between a current temperature of the YTF and a temperature of the YTF when it was last aligned exceeds an Alignment Expiration Temperature Change Threshold, wherein a current temperature is determined using a thermal model of the YTF that is stored in the spectrum analyzer.

6. The method of claim 1, further comprising:
   in step (iii), measuring values for at least two frequency alignment parameters and at least two gain alignment parameters of the YTF while the noise signal is applied to the input of the YTF and the tuning current is applied to the YTF, wherein the two frequency alignment parameters include a center frequency alignment parameter of the YTF and a peak frequency alignment parameter of the YTF, and the two gain alignment parameters include a center gain alignment parameter of the YTF and a peak gain alignment parameter of the YTF; and
   in step (iv), storing the values of the two frequency alignment parameters and two gain alignment parameters of the YTF in the alignment table in the memory device.

7. The method of claim 6, further comprising determining an operating current to be applied to the YTF for tuning the YTF to the operating frequency for measuring the characteristic of the externally-supplied signal, wherein determining the operating current comprises:
   determining an ideal tuning current value corresponding to the operating frequency for making the measurement;
   adjusting the ideal tuning current value using one of the frequency alignment parameter values stored in the alignment table; and
   generating the operating current corresponding to the adjusted ideal tuning current value.

8. The method of claim 7, wherein adjusting the ideal tuning current value using one of the frequency alignment parameters stored in the alignment table comprises:
   using one of the peak frequency alignment parameter values when a peak frequency validity test is passed; and
   using one of the center frequency alignment parameter values when the peak frequency validity test fails.

9. The method of claim 8, wherein measuring the characteristic of the externally-supplied signal at the operating frequency using a correction factor that is determined from one of the gain alignment parameter values in the alignment table comprises:
   using one of the peak gain alignment parameter values as the correction factor when a peak frequency validity test is passed; and
   using one of the center gain alignment parameter values as the correction factor when the peak frequency validity test fails.

10. The method of claim 9, wherein the peak frequency validity test includes a tuning uncertainty test that determines if an internal temperature change of the YTF between a current time and a time when the peak frequency alignment parameter value was last measured produces a tuning uncertainty that is less than a selected tuning uncertainty threshold, wherein a thermal model of the YTF is employed to determine the tuning uncertainty.

11. The method of claim 10, wherein the peak frequency validity test further includes:
   an age test that determines whether the age of the peak frequency alignment parameter value is less than a threshold age; and
   an age/frequency-difference test that determines whether a product of the age of the peak frequency alignment parameter value and the frequency difference between the operating frequency and the peak frequency alignment parameter value is less than an age/frequency-difference product threshold.

12. A measurement instrument, comprising:
a signal input configured to receive an externally-supplied signal;
a noise source;
a tunable filter;
a measurement circuit connected to receive an output of the tunable filter;
a switch adapted to selectively connect one of the input and the noise source to an input of the filter;
a memory device; and
a processor configured to control the switch and the tunable filter, the processor being further configured to execute an alignment algorithm comprising:
(i) applying an output signal of an internal noise source of the measurement instrument to the input of the tunable filter,
(ii) applying a control signal to the tunable filter to tune the tunable filter to a selected alignment frequency,
(iii) measuring a value of a gain alignment parameter of the tunable filter while the output signal of the internal noise source is applied to the input of the tunable filter and the control signal is applied to the tunable filter,
(iv) storing the measured gain alignment parameter value in the memory device, and
(v) repeating steps (ii) through (iv) for a plurality (N) of selected alignment frequencies in an operating frequency range of the tunable filter.

13. The measurement instrument of claim 12, wherein the tunable filter is an yttrium-iron garnet (YIG) tuned filter (YTF), and wherein the control signal is a tuning current for tuning a frequency characteristic of the YTF.

14. The measurement instrument of claim 13, wherein the processor is configured to update at least one entry in the alignment table by executing an alignment update algorithm in response to a determination that an absolute value of a difference between a current temperature of the YTF and a temperature of the YTF when it was last aligned exceeds an Alignment Expiration Temperature Change Threshold, wherein a current temperature is determined using a thermal model of the YTF that is stored in the measurement instrument.

15. The measurement instrument of claim 13, wherein the processor is further configured to execute a measurement algorithm comprising:
receiving an externally-supplied signal at an input of the measurement instrument;
determining an operating current to be applied to the YTF for tuning the YTF to an operating frequency for measuring a characteristic of the externally-supplied signal;
tuning the YTF to the operating frequency; and
measuring the characteristic of the externally-supplied signal at the operating frequency using the YTF and a correction factor that is determined from one of the gain alignment parameter values in the alignment table,
wherein determining the operating current to be applied to the YTF for tuning the YTF to the operating frequency comprises:
determining an ideal tuning current value corresponding to the operating frequency for making the measurement;
adjusting the ideal tuning current value using a frequency alignment parameter value stored in the alignment table; and
generating the operating current corresponding to the adjusted ideal tuning current value,
wherein adjusting the ideal tuning current value using the frequency alignment parameter value stored in the alignment table comprises:
using a peak frequency alignment parameter value when a peak frequency validity test is passed; and
using a center frequency alignment parameter value when the peak frequency validity test fails,
wherein the peak frequency validity test includes a tuning uncertainty test that determines if an internal temperature change of the YTF between a current time and a time when the peak frequency parameter value was last measured produces a tuning uncertainty that is less than a selected tuning uncertainty threshold, wherein a thermal model of the YTF is employed to determine the tuning uncertainty.

16. A method of operating a measurement instrument including a tunable filter, the method comprising:
(i) applying an output signal of an internal noise source of the measurement instrument to the input of the tunable filter,
(ii) applying a control signal to the tunable filter to tune the tunable filter to a selected alignment frequency,
(iii) measuring a value for a gain alignment parameter of the tunable filter while the output signal of the internal noise source is applied to the input of the tunable filter and the control signal is applied to the tunable filter,
(iv) storing the measured gain alignment parameter value in an alignment table in the memory device, and
(v) repeating steps (ii) through (iv) for a plurality (N) of selected alignment frequencies in an operating frequency range of the tunable filter.

17. The method of claim 16, further comprising:
receiving an externally-supplied signal at an input of the measurement instrument; and
measuring at least one characteristic of the externally-supplied signal using the tunable filter and a correction factor that is determined from one of the gain alignment parameter values from the alignment table.

18. The method of claim 17, wherein step (iii) further includes:
measuring a peak frequency alignment parameter value for the tunable filter; and
measuring a center frequency alignment parameter value for the tunable filter,
wherein measuring at least one characteristic of the externally-supplied signal using the tunable filter and one of the gain alignment parameter values from the alignment table comprises:
tuning the tunable filter to an operating frequency using one of the peak frequency alignment parameter values when the tunable filter passes a tuning uncertainty test that determines if an internal temperature change of the tunable filter between a current time and a time when the peak frequency parameter was measured produces a tuning uncertainty that is less than a selected tuning uncertainty threshold, wherein a thermal model of the tunable filter is employed to determine the tuning uncertainty, and
tuning the tunable filter to the operating frequency using one of the center frequency alignment parameter values when the tunable filter fails the tuning uncertainty test.

19. The method of claim 16, further comprising:
in response to a triggering event, updating P entries in the alignment table, said updating comprising:
  (vi) applying the noise signal generated by the internal noise source of the spectrum analyzer to the input of the tunable filter,
  (vii) applying a control signal to the tunable filter to tune the tunable filter to a selected alignment frequency,
  (viii) measuring a new value for the gain alignment parameter of the tunable filter while the output signal of the internal noise source is applied to the input of the tunable filter and the control signal is applied to the tunable filter,
  (ix) storing the new measured gain alignment parameter value in the alignment table in the memory device, and
  (x) repeating steps (vi) through (ix) for P selected alignment frequencies in an operating frequency range of the tunable filter, where P<N.

20. The method of claim 19, wherein the triggering event is an instruction, received via an interface of the measurement instrument, to perform a single frequency alignment update, wherein P=1.

* * * * *